(12) United States Patent
Chhagan et al.

(10) Patent No.: US 6,284,637 B1
(45) Date of Patent: Sep. 4, 2001

(54) METHOD TO FABRICATE A FLOATING GATE WITH A SLOPING SIDEWALL FOR A FLASH MEMORY

(75) Inventors: Vijai Komar N. Chhagan, Belgrave (GB); Yelehanka Machandramurthy Pradee, Singapore (SG); Mei Sheng Zhou, Singapore (SG); Henry Gerung, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/280,023

(22) Filed: Mar. 29, 1999

(51) Int. Cl.[7] .................................................. H01L 21/8247
(52) U.S. Cl. ........................ 438/594; 438/264; 438/713; 438/716; 438/261
(58) Field of Search .................................. 438/257–267, 438/978, 713, 719, 593–594

(56) References Cited

U.S. PATENT DOCUMENTS

| | | | |
|---|---|---|---|
| 5,554,564 | 9/1996 | Nishioka et al. | 437/192 |
| 5,573,979 | 11/1996 | Tsu et al. | 437/195 |
| 5,635,416 | 6/1997 | Chen et al. | 438/258 |
| 5,830,807 | * 11/1998 | Matsunaga et al. | 438/714 |
| 5,973,353 | * 10/1999 | Yang et al. | 257/315 |
| 6,051,451 | * 4/2000 | He et al. | 438/142 |
| 6,063,668 | * 5/2000 | He et al. | 438/264 |

OTHER PUBLICATIONS

Wolf et al., "Silicon Processing for the VLSI Era vol. 1: Process Technology", Lattice Press, pp. 551–554, 1986.*
Wolf et al., Silicon Processing for the VLSI Era vol. 1: Process Technology, pp. 547–549, 1986, Lattice Press.*

* cited by examiner

Primary Examiner—Richard Booth
(74) Attorney, Agent, or Firm—George O. Saile; Rosemary L. S. Pike

(57) ABSTRACT

A method to fabricate a floating gate with a sloping sidewall for a Flash Memory is described. Field oxide isolation regions are provided in the substrate. A silicon oxide layer is provided overlying the isolation regions and the substrate. A first polysilicon layer is deposited overlying the silicon oxide layer. A photoresist layer is deposited overlying the first polysilicon layer. The photoresist layer is etched to remove sections of the photoresist as defined by photolithographic process. The photoresist layer, the first polysilicon layer, and the silicon oxide layer are etched in areas uncovered by the photoresist layer to create structures with sloping sidewall edges. The photoresist layer is etched away. An interpoly dielectric layer is deposited overlying the structures, the sloping sidewall edges, and the isolation regions. A second polysilicon layer is deposited overlying the interpoly dielectric and the fabrication of the integrated circuit device is completed.

15 Claims, 3 Drawing Sheets

US 6,284,637 B1

METHOD TO FABRICATE A FLOATING GATE WITH A SLOPING SIDEWALL FOR A FLASH MEMORY

BACKGROUND OF THE INVENTION (1) Field of the Invention

The invention relates to a method of fabricating semiconductor memory structures, and more particularly, to the formation of a floating gate with a sloping sidewall for a Flash Memory Cell.

(2) Description of the Prior Art

Flash EEPROMs are a well-known class of semiconductor devices in the art. These devices are used in many digital circuit applications where binary data must be retained even if the application system power is removed. Further, these devices allow the data to be altered, or re-written, during normal operations.

EEPROM memory devices employ floating gates; that is Field Effect Transistor (FET) gates completely surrounded by an isolating layer such as silicon oxide. The presence of charge on these floating gates effectively shifts the threshold voltage of the FET. This effect can be detected by additional circuitry such that the charge state of the floating gate can be used to represent binary information. Specifically, FLASH EEPROM memories employ EEPROM cells in a configuration that allows for the bulk erasing, or flashing, of large blocks of memory cells in a normal circuit application without using any external data erasing source, such as ultra-violet light.

FIG. 1 shows a cross sectional view of a partially completed prior art EEPROM memory cell. The cell contains a substrate 11 typically composed of lightly P- doped monocrystalline silicon. Isolation regions 12 extend above and below the substrate surface to effectively isolate this memory cell from surrounding cells. The region defined along the substrate surface between the two isolation regions 12 is called the active region. A tunneling oxide layer 13 overlays the substrate 11 and the isolation regions 12. A polysilicon floating gate 14 overlays the tunneling oxide 13. The tunneling oxide 13 serves as an isolator between the floating gate 14 and the substrate 11. An interpoly dielectric film 15, typically comprised of oxide-nitride-oxide, or ONO, overlays the floating gate 14. Another layer of polysilicon forms the control gate 16 of the memory cell. The interpoly dielectric film 15 serves as an isolator between the control gate 16 and the floating gate 14. The overlaying layers of control gate 16, interpoly dielectric 15, floating gate 14, and tunneling oxide 13 over substrate 11 form a stacking gate structure.

Data is stored in the EEPROM cells by the storage of a charge on the floating gate 14. Because this gate 14 is electrically isolated from both the substrate 11 and the control gate 16, a charge can be stored for indefinite periods without any voltage applied to the gate 14. To charge or write data to the floating gate 14, a voltage must be applied from the control gate 16 to the substrate 11. This voltage is divided across the capacitor formed by the control gate 16, the interpoly dielectric 15, and the floating gate 14, and the capacitor formed by the floating gate 14, the tunneling oxide 13, and the substrate 11. If the voltage from the floating gate 14 to the substrate 11 is large enough, charge movement will occur as electrons tunnel from the substrate 11 to the floating gate 14 through the tunneling oxide layer 13. When the voltage from control gate 16 to substrate 11 is reduced or removed, the charge is trapped on the floating gate 14 and the data is retained in the memory cell. The presence of this charge increases the threshold voltage of the memory cell FET, and this can be detected by a cell sense circuit.

A prominent feature of the prior art cell shown in FIG. 1 is severe topology introduced by the field oxide 12 isolation. Because the polysilicon floating gate 14 overlaps this isolation 12, as well as the tunneling oxide layer 13, all of the subsequent layers of material reflect this topology. Notably, a sharp corner exists at the polysilicon floating gate edge 18. This sharp corner causes problems with the integrity of the interpoly dielectric 15. The effective breakdown probability of the interpoly dielectric is increased, as is the amount of charge leakage between the floating gate 14 and the control gate 16. The effect of this charge leakage is the performance of the slash memory cell is deteriorated. As charge leaks off the floating gate 14, the effective threshold voltage of the memory cell FET is altered, compromising the data held on the cell.

A prior art attempt to reduce the sharpness of the floating gate edge is taught in U.S. Pat. No. 5,635,416 to Chen et al. Chen et al teaches the formation of tunnel oxide and the first part of the floating gate polysilicon prior to the formation of the isolation oxide. The second part of the floating gate extends on to the isolation oxide. U.S. Pat. No. 5,573,979 to Tsu et al shows a sloped polysilicon sidewall for a memory device. However, Tsu is directed at capacitor electrodes and teaches a sloping sidewall method for what are termed unreactive and barrier layers such as platinum and titanium nitride, respectively, in the formation of three-dimensional capacitor nodes for DRAM. U.S. Pat. No. 5,554,564 to Nishioka et al shows a method of rounding the bottom capacitor electrode through the oxidation of the noble metals used.

SUMMARY OF THE INVENTION

A principal object of the present invention is to provide an effective and very manufacturable method of fabricating a floating gate structure for a Flash EEPROM cell.

Another object of the present invention is to provide an effective and very manufacturable method of fabricating a floating gate structure for a Flash EEPROM device having an improved profile and performance.

Yet another object of the present invention is to provide an effective and manufacturable floating gate structure for a Flash EEPROM device.

In accordance with the objects of this invention, a new method of fabricating floating gates for Flash EEPROM devices having an improved profile and performance is achieved. A semiconductor substrate is provided. Field oxide regions are formed in this substrate. A tunneling oxide layer is provided overlying both the substrate and the field oxide regions. A first polysilicon layer is deposited overlying the tunneling oxide layer. A photoresist layer is deposited overlying the first polysilicon layer. The photoresist layer is patterned and etched leaving the photoresist layer where the floating gates are to be defined. The photoresist layer, the first polysilicon layer and the tunneling oxide are specially etched to both define the floating gate structures and to create non-vertical, sloping sidewalls. The remaining photoresist layer is removed. An interpoly dielectric is deposited overlying the floating gates and the rest of the wafer. A second polysilicon layer is deposited overlying the interpoly dielectric completing the fabrication of the floating gates for the Flash/EEPROM devices.

Also in accordance with the objects of this invention, a floating gate for a Flash EEPROM device having an improved profile and performance is achieved. Field oxide isolations define active areas in the semiconductor substrate. A tunneling oxide overlies the semiconductor substrate. A polysilicon floating gate with non-vertical, sloping sidewalls overlies the tunneling oxide. An interpoly dielectric overlies the polysilicon layer. A control gate of polysilicon overlies the interpoly dielectric to complete the floating gate structure for the Flash EEPROM device.

BRIEF DESCRIPTION OF THE DRAWINGS

In the accompanying drawings forming a material part of this description, there is shown.

DESCRIPTION OF THE PREFERRED EMBODIMENTS

Figure 2:
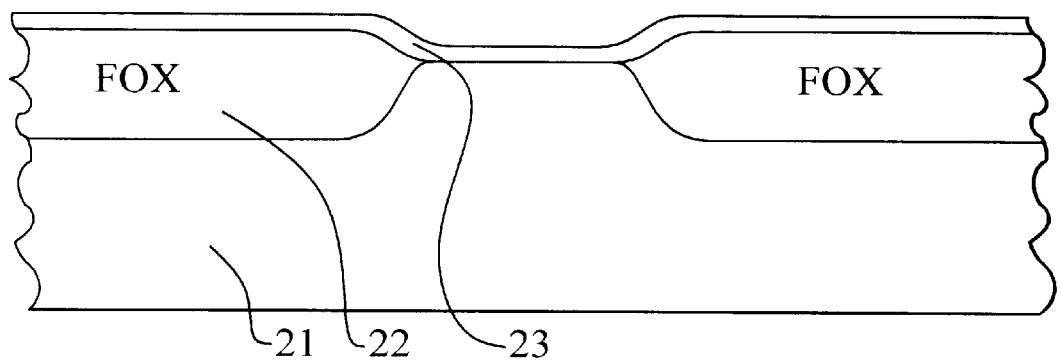
FIGS. 2 through 6 schematically illustrate in cross-sectional representation a preferred embodiment of the present invention.

Without unduly limiting the scope of the invention, a preferred embodiment will be described herein. Referring now more particularly to FIG. 2, there is illustrated a portion of a partially completed memory cell. Semiconductor substrate 21 is preferably composed of monocrystalline silicon. Isolation regions are formed in or on the semiconductor substrate 21 to isolate active regions from one another. For example, as shown in FIG. 2, field oxidation regions 22 are formed through the method known as local oxidation of silicon (LOCOS).

The surface of the substrate is oxidized to form the tunneling oxide layer 23 to a thickness of between about 30 and 80 Angstroms.

Figure 3:
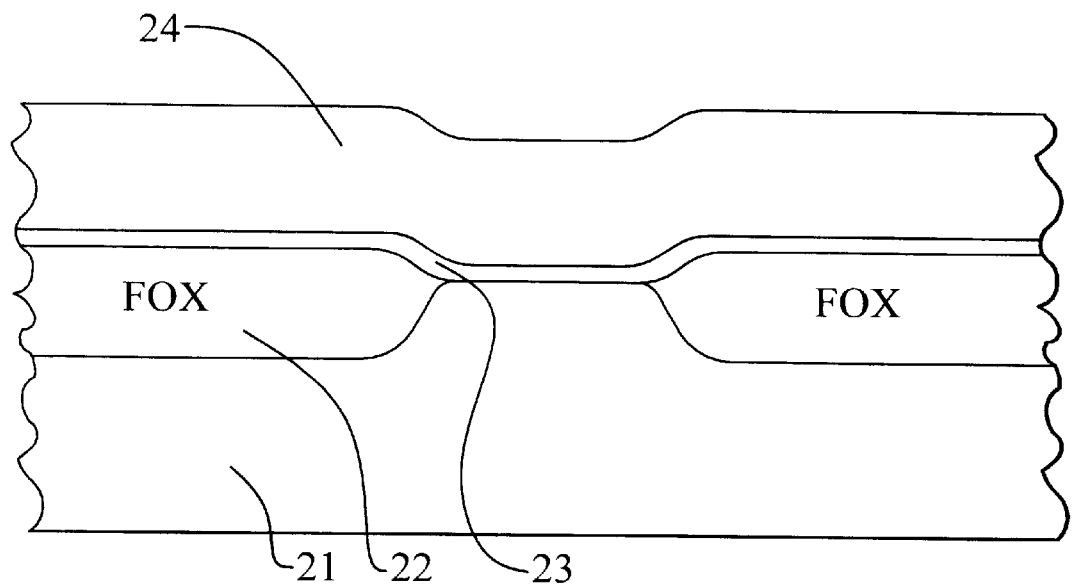

Referring now to FIG. 3, a first polysilicon layer 24 is deposited conventionally overlying the tunneling oxide preferably to a thickness of between about 1000 and 2500 Angstroms.

Figure 4:
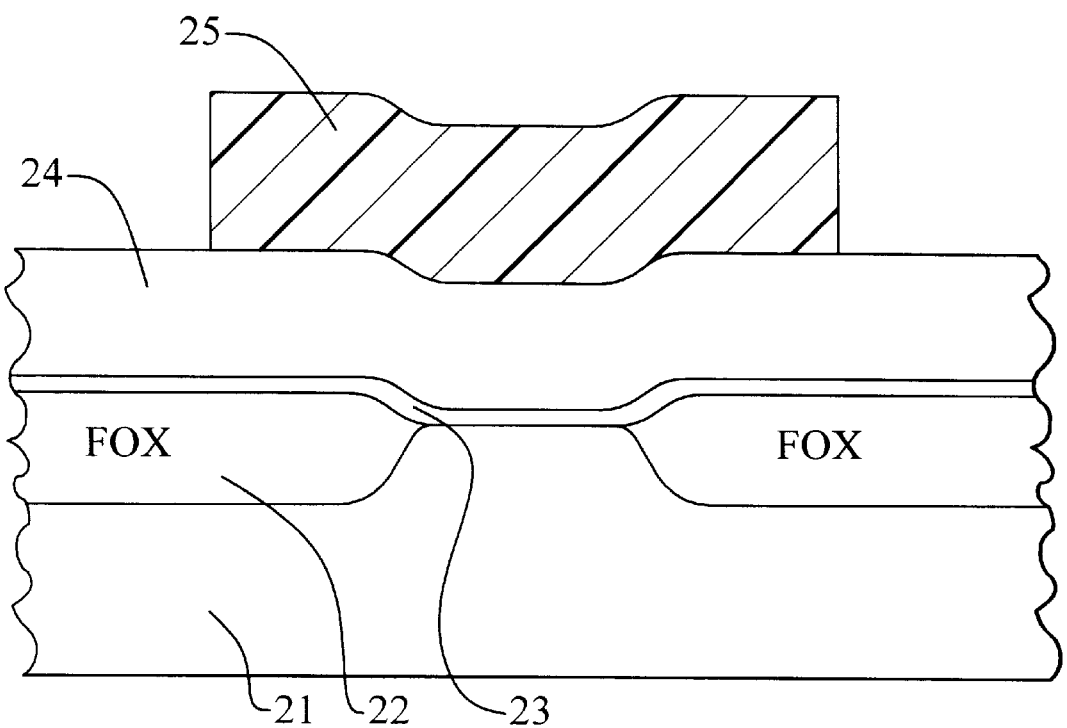

Referring to FIG. 4, a layer of photoresist 25 is deposited overlying the first polysilicon layer 24 to a thickness of between about 6 and 8 microns. The photoresist layer 25 is exposed to a conventional photolithographic masking operation. The photoresist layer 25 is developed conventionally to open areas where the first polysilicon layer 24 also must be etched away.

Figure 5:
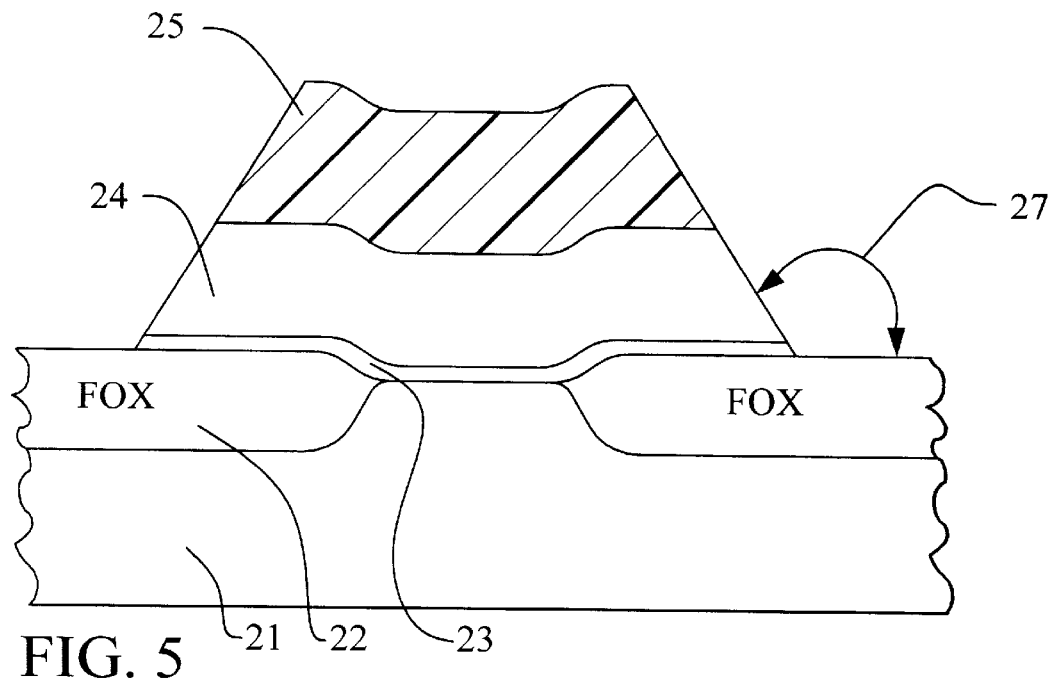

Referring now to FIG. 5, the first polysilicon layer is now preferably etched using a reactive ion etching (RIE) process. This is the key feature of the invention method. In the conventional art, the polysilicon is etched using an anisotropic etch that results in very steep, ideally vertical, edges. In the invention, the polysilicon is etched using an isotropic etch that removes material in both the vertical as well as the horizontal directions. The resulting structural profile is shown in FIG. 5. The sidewalls of the floating gate 24 formed an obtuse angle with respect to the surface of the isolation region 22 as indicated by 27. The angle 27 formed by the sloped sidewall edges and the isolation region 22 is between about 95 and 105 degrees.

The process composition, gas flow, pressure, and plasma potential for the RIE etch were carefully developed to achieve the desired etching profile. Specifically, $Cl_2$ gas is flowed at between about 50 SCCM and 150 SCCM, $CF_4$ gas is flowed at between about 50 SCCM and 150 SCCM, HBr gas is flowed at between about 50 SCCM and 150 SCCM, and $O_2$ gas is flowed at between about 1 SCCM and 5 SCCM. A pressure of between about 5 milliTorr and 20 milliTorr is maintained during etching. Finally a plasma is generated using Tcp coil with a top coil power range between about 100 watts and 250 watts and a bottom bias power range of between about 50 watts and 150 watts.

Figure 6:
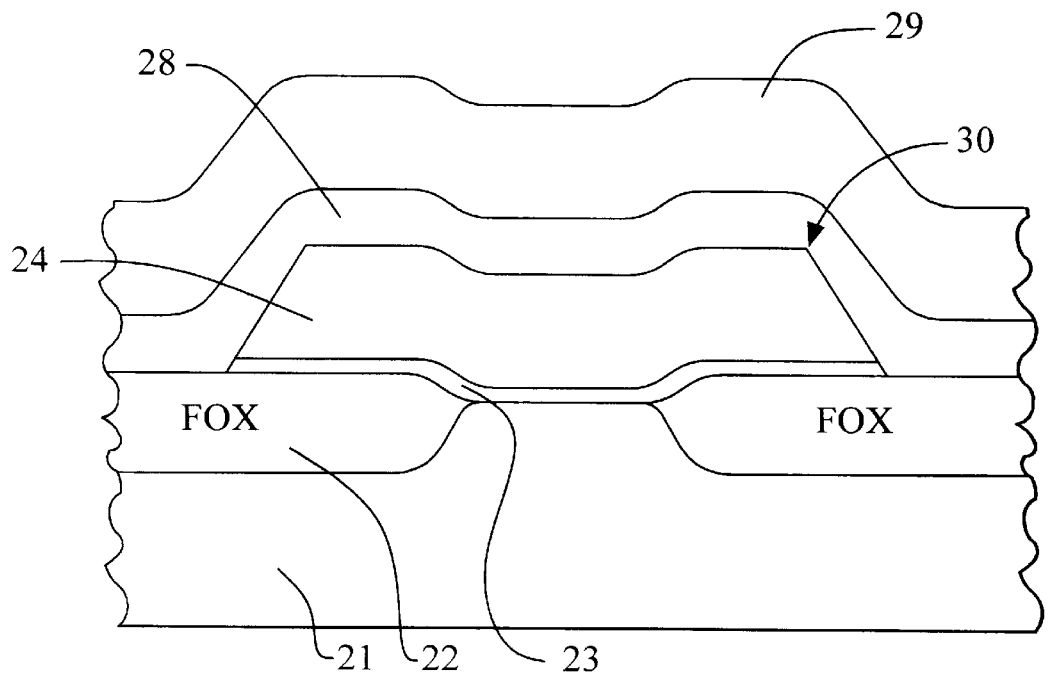

Following the polysilicon etch, the remaining photoresist layer 25 is now removed. Referring now to FIG. 6, a layer of interpoly dielectric 28 is deposited overlying the floating gate 24. The interpoly dielectric layer is preferably an oxide-nitride-oxide, or ONO, stack. The interpoly dielectric is comprised of a first layer of silicon oxide having a thickness of between about 30 and 160 Angstroms, a second layer of silicon nitride having a thickness of between about 30 and 160 Angstroms, and a topmost layer of silicon oxide having a thickness of between about 30 and 100 Angstroms.

A second polysilicon layer 29 is deposited overlying the interpoly dielectric. This layer will form the control gate of the completed Flash EEPROM device.

Figure 1:
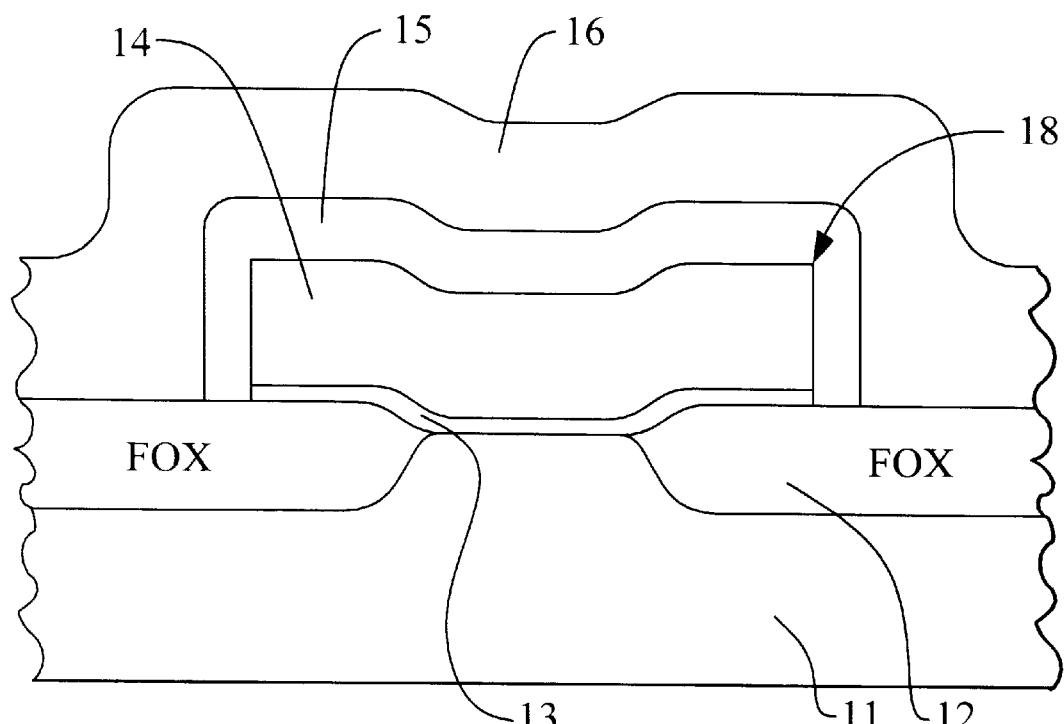
FIG. 1 schematically illustrates in cross-sectional representation a partially completed Flash EEPROM structure in accordance with prior art.

It can now be demonstrated how the process features positively impact the performance and manufacturability of the floating gate structure. Compare the cross section of the preferred embodiment version of the floating gate depicted in FIG. 6 with the cross section of the prior art floating gate of FIG. 1. The edges of the floating gates of the preferred embodiment have sloping sidewalls. This sloping translates into a likewise sloped corner of the overlying interpoly dielectric. Because of this profile, there are fewer points of leakage in the dielectric and, therefore, the floating gate of the preferred embodiment holds charge better than that of the prior art.

The process of the present invention provides a very manufacturable process for fabricating a floating gate having sloping sidewalls for a Flash EEPROM. The device improves on the prior art described above and represents a new approach to Flash EEPROM device processing.

While the invention has been particularly shown and described with reference to the preferred embodiments thereof; it will be understood by those skilled in the art that various changes in form and details may be made without departing from the spirit and scope of the invention.

What is claimed is:

1. A method for fabrication of an integrated circuit device comprising:

providing a semiconductor substrate;

providing field oxide isolation regions in said substrate;

providing a silicon oxide layer overlying said isolation regions and said substrate;

depositing a first polysilicon layer overlying said silicon oxide layer;

forming a photoresist mask overlying said first polysilicon layer;

etching away said first polysilicon layer and said silicon oxide layer in areas not covered by said photoresist mask to create structures with outwardly sloping sidewall edges that intersect said isolation regions at an obtuse angle of between 95 and 105 degrees wherein etching gases for said etching consist of $Cl_2$, $CF_4$, HBr, and $O_2$;

removing said photoresist mask;

depositing an interpoly dielectric layer overlying said structures, said sloping sidewall edges, and said isolation regions;

depositing a second polysilicon layer overlying said interpoly dielectric; and completing said fabrication of said integrated circuit device.

2. The method according to claim 1 wherein said first polysilicon layer is deposited to a thickness of between about 1000 and 2500 Angstroms.

3. The method according to claim 1 wherein said etching away to create said structures with outwardly sloping sidewall edges uses an isotropic etching process.

4. The method according to claim 1 wherein said step of etching away to create said structures with outwardly sloping sidewall edges uses a reactive ion etch process comprising $Cl_2$ gas flowed at between about 50 SCCM and 150 SCCM, $CF_4$ gas flowed at between about 50 SCCM and 150 SCCM, HBr gas flowed at between about 50 SCCM and 150 SCCM, and $O_2$ gas flowed at between about 1 SCCM and 5 SCCM, a pressure of between about 5 milliTorr and 20 milliTorr, and plasma generation using Tcp coil with a top coil power range between about 100 watts and 250 watts and a bottom bias power range of between about 50 watts and 150 watts.

5. The method according to claim 1 wherein said photoresist layer is deposited to a thickness of between about 6 and 8 microns.

6. The method according to claim 1 wherein said step of depositing said interpoly dielectric layer comprises:
   depositing a first layer of silicon oxide overlying said first polysilicon layer to a thickness of between about 30 and 100 Angstroms;
   deposition a layer of silicon nitride overlying said first layer of silicon oxide to a thickness of between about 30 and 100 Angstroms; and
   forming a second layer of silicon oxide overlying said layer of silicon nitride to a thickness of between about 30 and 100 Angstroms.

7. A method for fabrication of stacked gate structure for a Flash EEPROM cell:
   providing a semiconductor substrate;
   providing field oxide isolation regions in said substrate;
   providing a tunneling oxide layer overlying said isolation regions and said substrate;
   depositing a first polysilicon layer overlying said tunneling oxide layer;
   forming a photoresist mask overlying said first polysilicon layer;
   isotropically etching away said first polysilicon layer and said tunneling oxide layer in areas not covered by said photoresist mask to create said floating gates with outwardly sloping sidewall edges that intersect said isolation regions at an obtuse angle of between 95 and 105 degrees wherein etching gases for said etching consist of $Cl_2$, $CF_4$, HBr, and $O_2$;
   etching away said photoresist layer;
   depositing an interpoly dielectric layer overlying said floating gates, said sloping sidewall edges, and said isolation regions;
   depositing a second polysilicon layer overlying said interpoly dielectric; and
   completing said fabrication of stacked gate structures in said Flash EEPROM cells.

8. The method according to claim 7 wherein said first polysilicon layer is deposited to a thickness of between about 1000 and 2500 Angstroms.

9. The method according to claim 7 wherein said step of isotropically etching away to create said floating gates with outwardly sloping sidewall edges uses a reactive ion etch process comprising $Cl_2$ gas flowed at between about 50 SCCM and 150 SCCM, $CF_4$ gas flowed at between about 50 SCCM and 150 SCCM, HBr gas flowed at between about 50 SCCM and 150 SCCM, and $O_2$ gas flowed at between about 1 SCCM and 5 SCCM, a pressure of between about 5 milliTorr and 20 milliTorr, and plasma generation using Tcp coil with a top coil power range between about 100 watts and 250 watts and a bottom bias power range of between about 50 watts and 150 watts.

10. The method according to claim 7 wherein tunneling oxide is provided to a thickness of between about 30 and 100 Angstroms.

11. The method according to claim 7 wherein said step of depositing said interpoly dielectric layer comprises:
   depositing a first layer of silicon oxide overlying said first polysilicon layer to a thickness of between about 50 and 200 Angstroms;
   deposition a layer of silicon nitride overlying said first layer of silicon oxide to a thickness of between about 30 and 200 Angstroms; and
   depositing a second layer of silicon oxide overlying said layer of silicon nitride to a thickness of between about 30 and 100 Angstroms.

12. A method for fabrication of stacked gate structure for a Flash EEPROM cell:
   providing a semiconductor substrate;
   providing field oxide isolation regions in said substrate;
   providing a tunneling oxide layer overlying said isolation regions and said substrate;
   depositing a first polysilicon layer overlying said tunneling oxide layer;
   isotropically etching away said first polysilicon layer and said tunneling oxide layer in areas not covered by said photoresist mask to create said floating gates with outwardly sloping sidewall edges that intersect said isolation regions at an obtuse angle of between 95 and 105 degrees using a reactive ion etch process consisting of $Cl_2$ gas flowed at between 50 and 150 SCCM, $CF_4$ gas flowed at between 50 and 150 SCCM, HBr gas flowed at between 50 and 150 SCCM, and $O_2$ gas flowed at between about 1 and 5 SCCM, a pressure of between 5 and 20 milliTorr, and plasma generation using Tcp coil with a top coil power range between 100 and 250 watts and a bottom bias power range of between 50 and 150 watts;
   etching away said photoresist layer;
   depositing an interpoly dielectric layer overlying said floating gates, said sloping sidewall edges, and said isolation regions;
   depositing a second polysilicon layer overlying said interpoly dielectric; and
   completing said fabrication of stacked gate structures in said Flash EEPROM cells.

13. The method according to claim 12 wherein said first polysilicon layer is deposited to a thickness of between about 1000 and 2500 Angstroms.

14. The method according to claim 12 wherein tunneling oxide is provided to a thickness of between about 30 and 100 Angstroms.

15. The method according to claim 12 wherein said step of depositing said interpoly dielectric layer comprises:
   depositing a first layer of silicon oxide overlying said first polysilicon layer to a thickness of between about 50 and 200 Angstroms;
   deposition a layer of silicon nitride overlying said first layer of silicon oxide to a thickness of between about 30 and 200 Angstroms; and
   depositing a second layer of silicon oxide overlying said layer of silicon nitride to a thickness of between about 30 and 100 Angstroms.

* * * * *

UNITED STATES PATENT AND TRADEMARK OFFICE
CERTIFICATE OF CORRECTION

PATENT NO. : 6,284,637 B1
DATED : September 4, 2001
INVENTOR(S) : Vijai Komar N. Chhagan, Yelehanka Ramachandramurthy Pradeep, Mei Sheng Zhou, Henry Gerung It is certified that error appears in the above-identified patent and that said Letters Patent is hereby corrected as shown below:

<u>Title page,</u>
Item [75] delete, "Yelehanka Machandramurthy Pradee" and replace with
-- Yelehanka Ramachandramurthy Pradeep --.

Signed and Sealed this

Second Day of April, 2002

*Attest:*

JAMES E. ROGAN
*Attesting Officer*     *Director of the United States Patent and Trademark Office*